(12) United States Patent
Hoshino et al.

(10) Patent No.: US 8,858,716 B2
(45) Date of Patent: Oct. 14, 2014

(54) VACUUM PROCESSING APPARATUS

(75) Inventors: Fumiaki Hoshino, Minamitsuru-gun (JP); Hajime Hiraiwa, Minamitsuru-gun (JP); Katsuhiko Miura, Minamitsuru-gun (JP)

(73) Assignee: Canon Anelva Corporation, Kawasaki-shi (JP)

( * ) Notice: Subject to any disclaimer, the term of this patent is extended or adjusted under 35 U.S.C. 154(b) by 842 days.

(21) Appl. No.: 12/974,228

(22) Filed: Dec. 21, 2010

(65) Prior Publication Data

US 2011/0155054 A1  Jun. 30, 2011

(30) Foreign Application Priority Data

Dec. 25, 2009  (JP) ................................ 2009-295199

(51) Int. Cl.
| | |
|---|---|
| *C23C 16/00* | (2006.01) |
| *C23F 1/00* | (2006.01) |
| *H01L 21/306* | (2006.01) |
| *H01L 21/683* | (2006.01) |
| *H01L 21/687* | (2006.01) |
| *H01L 21/677* | (2006.01) |
| *H01L 21/67* | (2006.01) |
| *C23C 16/458* | (2006.01) |

(52) U.S. Cl.
CPC .... *H01L 21/68721* (2013.01); *H01L 21/67748* (2013.01); *H01L 21/6719* (2013.01); *C23C 16/4585* (2013.01)
USPC ........... 118/729; 118/719; 118/728; 118/730; 156/345.31; 156/345.32; 156/345.51; 156/345.54; 156/345.55

(58) Field of Classification Search
CPC .............. H01L 21/6719; H01L 21/687; H01L 21/68721; H01L 21/68764; H01L 21/68785; C23C 16/4585
USPC .............. 118/715, 719, 728–733; 156/345.1, 156/345.22, 345.31–345.32, 345.51, 156/345.54–345.55; 204/298.01, 298.15, 204/298.23, 298.25, 295.28, 295.31, 204/298.35; 414/935–941
See application file for complete search history.

(56) References Cited

U.S. PATENT DOCUMENTS

| | | | | |
|---|---|---|---|---|
| 5,522,937 A | * | 6/1996 | Chew et al. ................... | 118/728 |
| 5,820,329 A | * | 10/1998 | Derbinski et al. ........ | 414/225.01 |
| 5,895,549 A | * | 4/1999 | Goto et al. ............... | 156/345.51 |
| 6,118,100 A | * | 9/2000 | Mailho et al. ................. | 219/390 |
| 6,248,222 B1 | * | 6/2001 | Wang ........................ | 204/297.09 |
| 6,936,134 B2 | * | 8/2005 | Yonemizu et al. ....... | 156/345.32 |
| 7,654,010 B2 | * | 2/2010 | Moriya et al. .................. | 34/449 |
| 8,118,940 B2 | * | 2/2012 | Shimizu et al. ............... | 118/728 |

FOREIGN PATENT DOCUMENTS

JP  8-250577  9/1996

* cited by examiner

*Primary Examiner* — Rakesh Dhingra
*Assistant Examiner* — Benjamin Kendall
(74) *Attorney, Agent, or Firm* — Fitzpatrick, Cella, Harper & Scinto (57) ABSTRACT

In a vacuum processing apparatus, a substrate chuck mechanism member is attached to a substrate holder provided in a vacuum processing chamber, includes a shaft member, first and second coil springs that are provided at the two ends, respectively, of the shaft member, and a substrate chuck plate provided at the end of the shaft member, and is additionally attached to the substrate holder using the substrate chuck plate by elastic biasing of the first coil spring. The holding state of the substrate on the substrate holder is changed by the expansion/contraction actions of the first and second coil springs in accordance with the reciprocal movement of the substrate holder.

4 Claims, 6 Drawing Sheets

SIDE OF
TRANSPORT CHAMBER 11

VACUUM PROCESSING APPARATUS

CROSS-REFERENCE TO RELATED APPLICATION

This application claims the benefit of Japanese Patent Application No. 2009-295199, filed Dec. 25, 2009, which is hereby incorporated by reference herein in its entirety.

BACKGROUND OF THE INVENTION

1. Field of the Invention

The present invention relates to a vacuum processing apparatus and, more particularly, to a vacuum processing apparatus which performs processing such as deposition on the surface of a substrate and includes a substrate holder equipped with a substrate chuck mechanism member.

2. Description of the Related Art

Conventionally, a vacuum processing apparatus which performs, for example, processing of forming a thin film on the surface of a substrate includes a substrate holding mechanism for positioning the substrate at a predetermined position inside a vacuum processing chamber in performing the processing on the substrate. The substrate holding mechanism normally includes, for example, a substrate holder having a mounting surface on which the substrate is placed, a support shaft which supports the substrate holder, and a driving device for rotating the substrate holder and the support shaft about its axis or reciprocally moving them within a predetermined range in its axial direction. The substrate holding mechanism also normally includes a substrate chuck device for fixing the substrate onto the substrate mounting surface of the substrate holder.

A substrate holding device disclosed in Japanese Patent Laid-Open No. 8-250577 will be taken as an example of the conventional substrate holding mechanisms. This substrate holding device is of a spinning/revolution type, and has a mechanism in which a substrate holding jig (corresponding to the substrate holder) spins while revolving, and a structure for cooling the substrate holding jig.

In the conventional vacuum processing apparatus, a driving device which vertically moves the substrate holder (reciprocally moves it in the axial direction of the support shaft) in the substrate holding mechanism, and a driving device of the substrate chuck device for fixing the substrate onto the substrate mounting surface of the substrate holder are separately, independently built into this apparatus as electric driving devices. Hence, the substrate chuck device has a complex arrangement and therefore requires a driving device dedicated to a substrate chuck, thus entailing a high fabrication cost.

SUMMARY OF THE INVENTION

The present invention has been made in consideration of the above-mentioned problem, and provides a vacuum processing apparatus which allows a substrate chuck operation of fixing a substrate onto the substrate mounting surface of a substrate holder only by reciprocally moving the substrate holder, in combination with the transport operation of a substrate transport mechanism, and therefore includes a vacuum processing chamber with a simpler arrangement to make it possible to reduce the fabrication cost.

According to the present invention, there is provided a vacuum processing apparatus comprising a transport chamber equipped with a substrate transport mechanism, a vacuum processing chamber which includes a substrate holding mechanism and processes a substrate fixed on a substrate mounting surface of a substrate holder in the substrate holding mechanism, and a communicating portion which is free to open to communicate the transport chamber and the vacuum processing chamber with each other in transporting the substrate from the transport chamber onto the substrate mounting surface of the substrate holder in the vacuum processing chamber by the substrate transport mechanism, wherein the substrate holding mechanism comprises a driving unit which reciprocally moves the substrate holder within a predetermined range in an axial direction of a support shaft which supports the substrate holder, and a substrate chuck mechanism member which includes a shaft member, a first elastic member and a second elastic member that are provided at two ends, respectively, of the shaft member, and a substrate chuck plate provided at the end of the shaft member, and is additionally attached to the substrate holder using the substrate chuck plate by elastic biasing of the first elastic member, and wherein a holding state of the substrate on the substrate holder is changed by expansion/contraction actions of the first elastic member and second elastic member in accordance with the reciprocal movement of the substrate holder.

According to the present invention, an operation of vertically moving a substrate holder and the transport operation of a substrate transport mechanism are performed in combination by attaching a substrate chuck mechanism member to a substrate holder provided in a vacuum processing chamber of a vacuum processing apparatus by means of a clamping action which utilizes the expansion/contraction elasticity of, for example, a coil spring. This allows a substrate chuck operation of fixing a substrate onto the substrate mounting surface of the substrate holder only by reciprocally moving the substrate holder in the vacuum processing chamber, and therefore includes, for example, a driving device with a simpler arrangement in the vacuum processing chamber to make it possible to reduce the fabrication cost.

Further features of the present invention will become apparent from the following description of exemplary embodiments with reference to the attached drawings.

DESCRIPTION OF THE EMBODIMENTS

A preferred embodiment (example) of the present invention will be described below with reference to the accompanying drawings.

Figure 1:
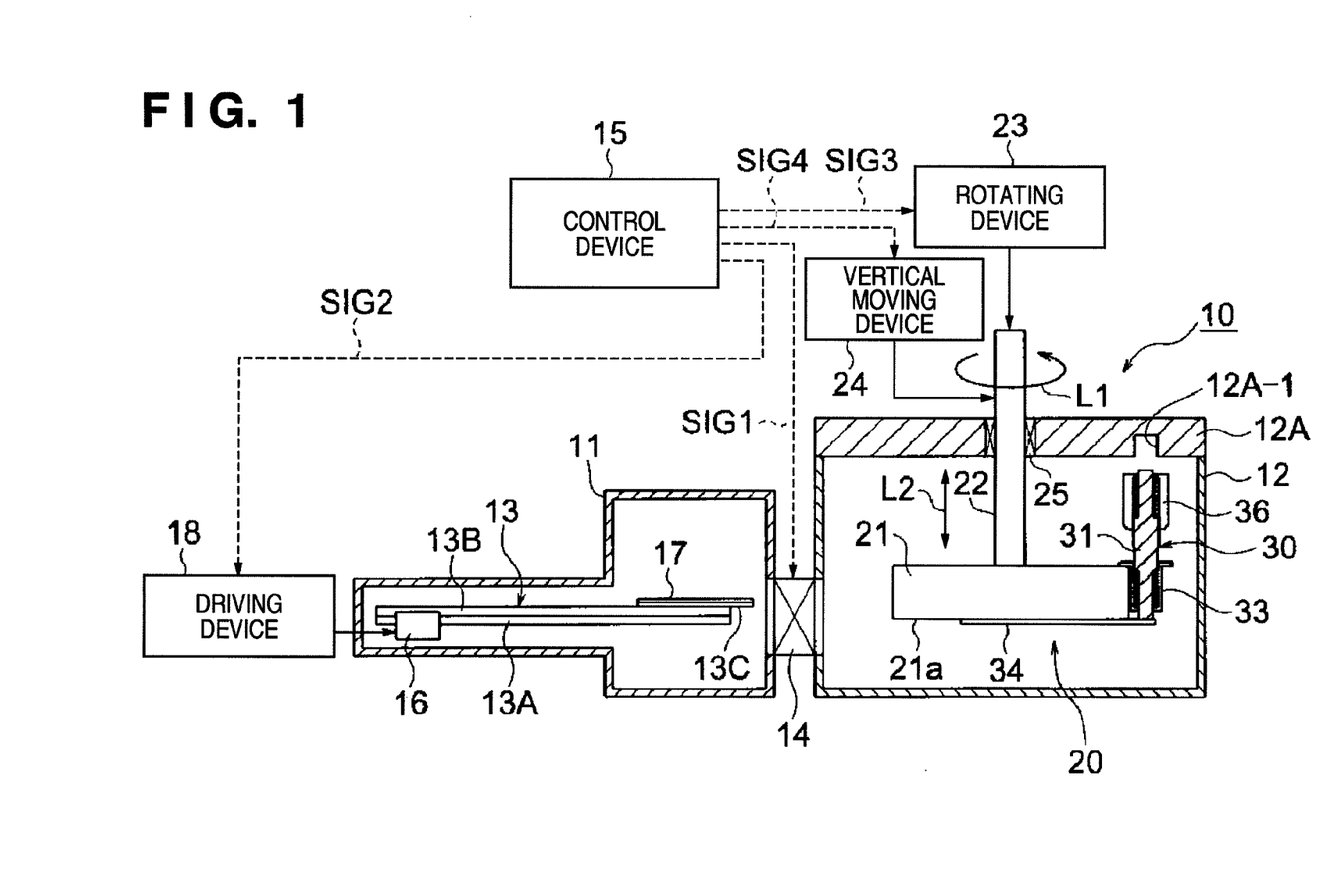
FIG. 1 is a longitudinal sectional view showing the internal structure and system configuration of a vacuum processing apparatus according to an embodiment of the present invention.
Figure 2:
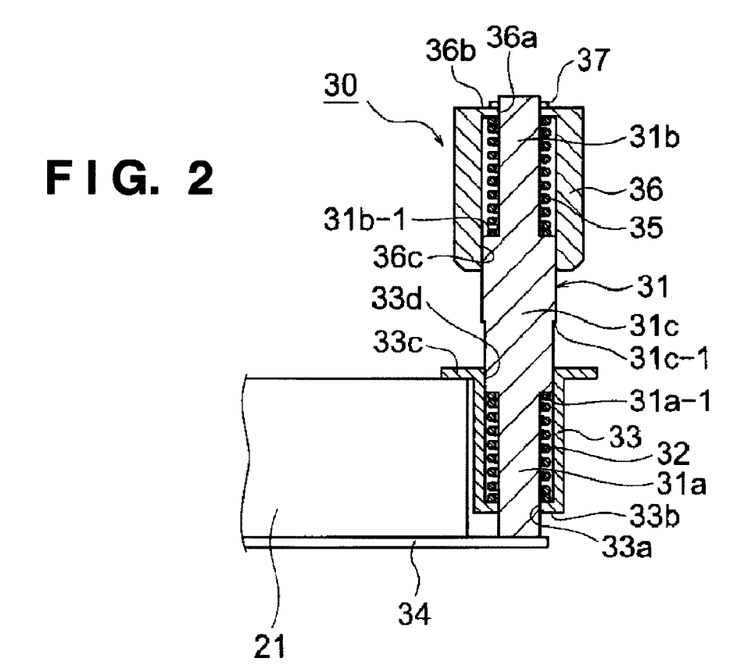
FIG. 2 is an enlarged longitudinal sectional view showing the structure of a substrate chuck mechanism member.
Figure 3:
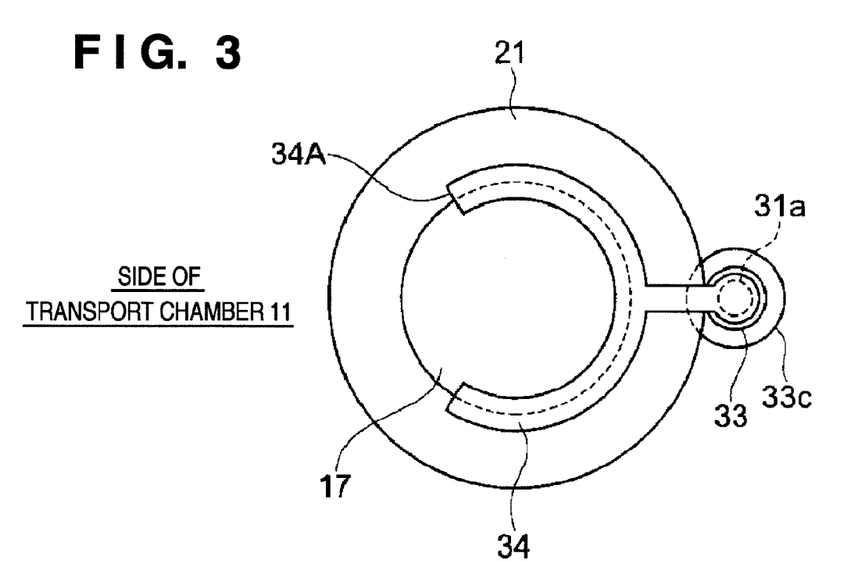
FIG. 3 is a view showing the substrate mounting surface of a substrate holder equipped with the substrate chuck mechanism member when viewed from below.

FIG. 1 shows the arrangement of a vacuum processing apparatus according to an embodiment of the present invention. FIG. 2 shows by enlargement the arrangement of a substrate chuck mechanism member. FIG. 3 shows the substrate mounting surface of a substrate holder equipped with the substrate chuck mechanism member when viewed from below.

In a vacuum processing apparatus 10 shown in FIG. 1, reference numeral 11 denotes a transport chamber which can at least be evacuated and includes a substrate transport mechanism 13 disposed in it; and 12, a vacuum processing chamber. The transport chamber 11 is evacuated to a required reduced-pressure level at a necessary timing by an exhaust device (not shown). The transport chamber 11 can also function as a load lock chamber. In the transport chamber 11, an unprocessed substrate supplied from outside the vacuum processing apparatus 10 is loaded into the vacuum processing apparatus 10 and the processed substrate is unloaded to the outside, both by the transport operation of the substrate transport mechanism 13. Moreover, as for the vacuum processing chamber 12, an unprocessed substrate is loaded into the vacuum processing chamber 12 and the processed substrate is unloaded from the vacuum processing chamber 12, both at appropriate timings by the transport operation of the substrate transport mechanism 13. The gate between the transport chamber 11 and its exterior is not shown in FIG. 1. A gate valve 14 is provided between the transport chamber 11 and the vacuum processing chamber 12 to form a communicating portion (gate) between them. FIG. 1 shows the state in which the gate valve 14 is closed. In transporting an unprocessed or processed substrate between the transport chamber 11 and the vacuum processing chamber 12 by the substrate transport mechanism 13, the substrate transport mechanism 13 is opened to form a communicating portion between the two chambers (transport chamber 11 and vacuum processing chamber 12). The opening/closing operation of the substrate transport mechanism 13 is executed by an opening/closing control signal SIG1 issued from a control device 15 including a microcomputer.

The substrate transport mechanism 13 provided inside the transport chamber 11 includes a lower arm 13A fixed in position, and an upper arm 13B which can rectilinearly slide rightward in FIG. 1 relative to the lower arm 13A. A rack and pinion mechanism 16 which transmits power is provided between the lower arm 13A and the upper arm 13B. A substrate receptacle 13C is provided at the distal end of the upper arm 13B. A substrate 17 to be transported is placed on the substrate receptacle 13C. Referring to FIG. 1, reference numeral 18 denotes a driving device for operating the substrate transport mechanism 13. The driving device 18 operates in response to a driving control signal SIG2 from the control device 15, and supplies power to the rack and pinion mechanism 16. Although the substrate transport mechanism 13 has a two-step arrangement in the above description, a multi-step slide guide mechanism can also generally be used as a rectilinear moving guide.

The vacuum processing chamber 12 is evacuated to a required reduced-pressure level in substrate processing. An exhaust device is not shown in FIG. 1. In processing the substrate in the vacuum processing chamber 12, a gas for inducing a reaction necessary for, for example, deposition is introduced into the vacuum processing chamber 12 and produces, for example, a plasma. A gas introduction device and a plasma generation device are not shown in FIG. 1.

In the vacuum processing chamber 12, reference numeral 20 denotes a substrate holding mechanism. The substrate holding mechanism 20 includes a substrate holder 21 having a substrate mounting surface 21a on which the substrate is placed, a support shaft 22 which supports the substrate holder 21, a rotating device 23 which rotates the support shaft 22 in a direction indicated by, for example, an arrow L1, and a vertical moving device 24 which reciprocally moves the support shaft 22 (vertically moves it in an example shown in FIG. 1) within a predetermined range in an axial direction indicated by, for example, an arrow L2. The substrate mounting surface 21a of the substrate holder 21 is the lower surface. The substrate holder 21 has a disk shape and a required thickness. The lower end of the support shaft 22 is fixed to the central portion of the upper surface of the substrate holder 21. The support shaft 22 penetrates through a ceiling plate 12A of the vacuum processing chamber 12. The ceiling plate 12A has a required thickness, and a seal member 25 which permits the rotating operation and reciprocating operation of the support shaft 22 and allows vacuum sealing is provided in the portion of the ceiling plate 12A, through which the support shaft 22 penetrates. Again, the ceiling plate 12A has a required thickness.

The operation of the rotating device 23 is controlled in accordance with a driving control signal SIG3 from the control device 15. Also, the operation of the vertical moving device 24 is controlled in accordance with a driving control signal SIG4 from the control device 15.

The substrate 17 is fixed onto the substrate mounting surface 21a of the substrate holder 21 in the substrate holding mechanism 20. A substrate chuck mechanism member 30 serves as a means for fixing the substrate 17 onto the substrate mounting surface 21a of the substrate holder 21. The substrate chuck mechanism member 30 has a rod shape as a whole and is an independent mechanism member. The substrate chuck mechanism member 30 has a clamping function which utilizes the elastic biasing action (expansion action) of two built-in elastic members such as coil springs. The substrate chuck mechanism member 30 is additionally attached to the substrate holder 21 such that the thick portion of the substrate holder 21 is clamped using this function. The substrate chuck mechanism member 30 rotates at the same time as the substrate holder 21 rotates in a direction indicated by the arrow L1, and vertically moves at the same time as the substrate holder 21 vertically moves within a predetermined range in a direction indicated by the arrow L2, both with respect to the substrate holding mechanism 20.

The substrate chuck mechanism member 30 will be described in more detail next with reference to FIGS. 2 and 3. The substrate chuck mechanism member 30 includes a rod-like shaft member 31, as shown in, for example, FIG. 2. The shaft member 31 has a small-diameter portion 31a which is formed at its lower end and has an axial length nearly equal to the thickness of the substrate holder 21, and a small-diameter portion 31b which is formed at its upper end and has nearly the same axial length as the small-diameter portion 31a. A large-diameter portion 31c is formed in the middle of the shaft member 31. In the shaft member 31, steps 31a-1 and 31b-1 are formed between the large-diameter portion 31c and the two small-diameter portions 31a and 31b, respectively. Also, a step 31c-1 is formed in nearly the middle of the large-diameter portion 31c in the axial direction.

A coil spring 32 which is longer than the axial length of the small-diameter portion 31a surrounds the small-diameter portion 31a at the lower end of the shaft member 31. A first cap member 33 having a bottom portion 33b which is formed in it and has a hole 33a through which the small-diameter portion 31a can extend, and an opening 33d which is formed in it and has a ring-like entrance flanged portion 33c further surrounds the coil spring 32. The large-diameter portion 31c of the shaft member 31 can be inserted into the opening 33d. In a state shown in FIG. 2, the coil spring 32 regulated by the step 31a-1 is pressed upward in the axial direction by the bottom portion 33b of the first cap member 33, thereby being compressed to a required level. A substrate chuck plate 34 is provided at the lower end of the small-diameter portion 31a. The substrate chuck plate 34 has, for example, a horseshoe shape (U shape) when viewed from a plan view, as shown in FIG. 3, and extends in a direction perpendicular to the axial direction of the shaft member 31. Based on the above-mentioned structure of the lower end of the substrate chuck mechanism member 30, the coil spring 32 is in a contracted state ready to expand in the axial direction of the shaft member 31, so an action with which the substrate chuck plate 34 and the entrance flanged portion 33c of the first cap member 33 clamp part of the edge of the substrate holder 21 between them in the thickness direction is generated. Based on the structure of the lower end of the substrate chuck mechanism member 30, the substrate chuck plate 34 and the entrance flanged portion 33c clamp the substrate holder 21 between them, thereby being attached to the substrate holder 21. Note that the horseshoe-shaped substrate chuck plate 34 is disposed such that its part 34A on the side of the transport chamber 11 opens, as shown in FIG. 3. The substrate 17 fixed in position by the substrate chuck plate 34 is not shown in FIG. 3 for the sake of descriptive convenience.

A coil spring 35 which is longer than the axial length of the small-diameter portion 31b surrounds the small-diameter portion 31b at the upper end of the shaft member 31. A cylindrical, second cap member 36 having a distal end 36b which has a hole 36a through which the small-diameter portion 31b can extend, and its other end which has a hole 36c through which the large-diameter portion 31c can extend further surrounds the coil spring 35. In a state shown in FIG. 2, the coil spring 35 regulated by the step 31b-1 is pressed upward in the axial direction by the distal end 36b of the second cap member 36, thereby being compressed to a required level. The second cap member 36 is regulated by a regulating ring 37 so as not to fall off the shaft member 31.

Also, as shown in FIG. 1, the distal end (upper end) of the small-diameter portion 31b of the shaft member 31 of the substrate chuck mechanism member 30 can fit into the inner surface (the lower surface in FIG. 1) of the ceiling plate 12A of the vacuum processing chamber 12 when the substrate chuck mechanism member 30 moves upward, together with the substrate holder 21. A hole 12A-1 with a required depth which is small enough not to receive the second cap member 36 is formed in that inner surface.

The two coil springs 32 and 35 built into the substrate chuck mechanism member 30 have different spring performances (compressive forces). In this embodiment, the compressive force of the coil spring 32 is set weaker than that of the coil spring 35. With this setting, when the same compressive force acts on the coil springs 32 and 35, the lower coil spring 32 compresses first, and the upper coil spring 35 compresses after the compression of the coil spring 35 is completed.

Although only one substrate chuck mechanism member 30 is provided to the substrate holder 21 in the above description, two or more substrate chuck mechanism members 30 can also be provided.

An operation of fixing the substrate 17 in position by the substrate holding mechanism 20 including the substrate holder 21 equipped with the substrate chuck mechanism member 30 having the above-mentioned arrangement will be described next with reference to FIGS. 4A and 4B to 7A and 7B. State views of the entire apparatus, which are shown in FIGS. 4A, 5A, 6A, and 7A, correspond to FIG. 1, and enlarged state views of the substrate chuck mechanism member 30, which are shown in FIGS. 4B, 5B, 6B, and 7B, correspond to FIG. 2.

Figure 4A:
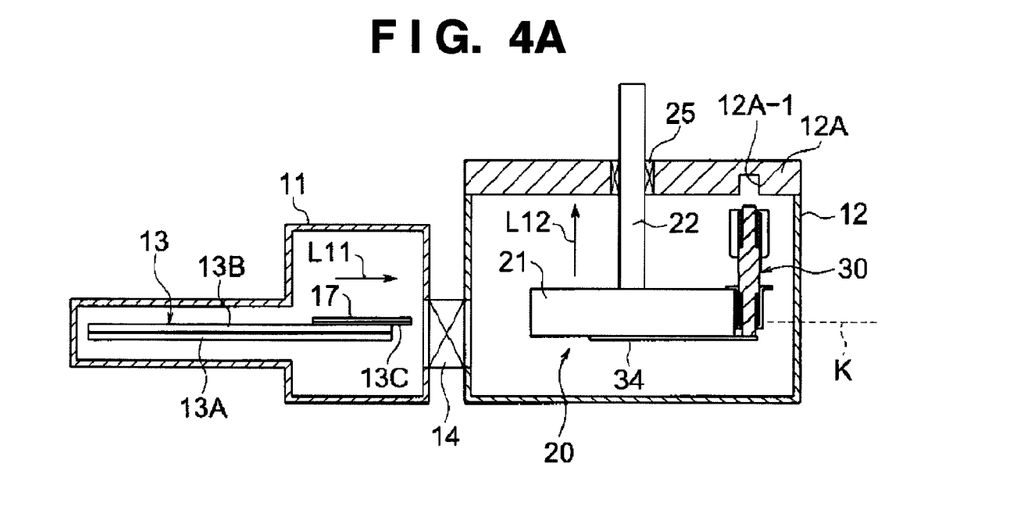
FIG. 4A is an operation state view of the entire apparatus, which shows a first operation state of, for example, a substrate holding mechanism included in the substrate holder equipped with the substrate chuck mechanism member.
Figure 4B:
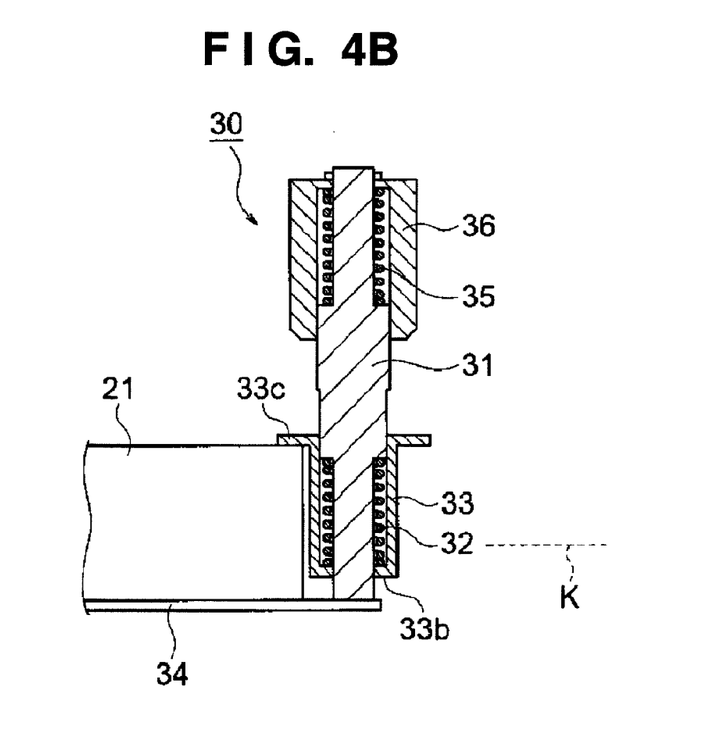
FIG. 4B is an enlarged operation state view of the substrate chuck mechanism member.

FIGS. 4A and 4B show the operation states before the substrate 17 placed on the substrate receptacle 13C of the substrate transport mechanism 13 is loaded into the vacuum processing chamber 12. The transport chamber 11 is evacuated to a required reduced-pressure level, and the upper arm 13B of the substrate transport mechanism 13 in the transport chamber 11 operates in a direction (rightward) indicated by an arrow L11 upon opening the gate valve 14. On the other hand, in the vacuum processing chamber 12, the substrate holder 21 and substrate chuck mechanism member 30 move in a direction (upward) indicated by an arrow L12, so the substrate chuck plate 34 moves up to a position indicated by a reference line K shown in FIG. 4B. The reference line K corresponds to a horizontal line defined at the level position at which the substrate receptacle 13C horizontally slides. The states shown in FIGS. 4A and 4B are the same as the structure and state described with reference to FIGS. 1 and 2. The two coil springs 32 and 35 built into the substrate chuck mechanism member 30 have both maximally expanded in this state.

Figure 5A:
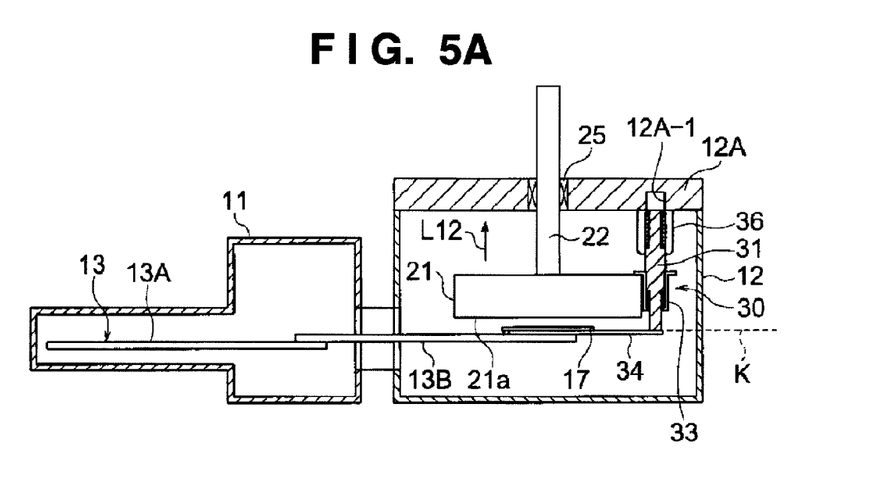
FIG. 5A is an operation state view of the entire apparatus, which shows a second operation state of, for example, the substrate holding mechanism included in the substrate holder equipped with the substrate chuck mechanism member.
Figure 5B:
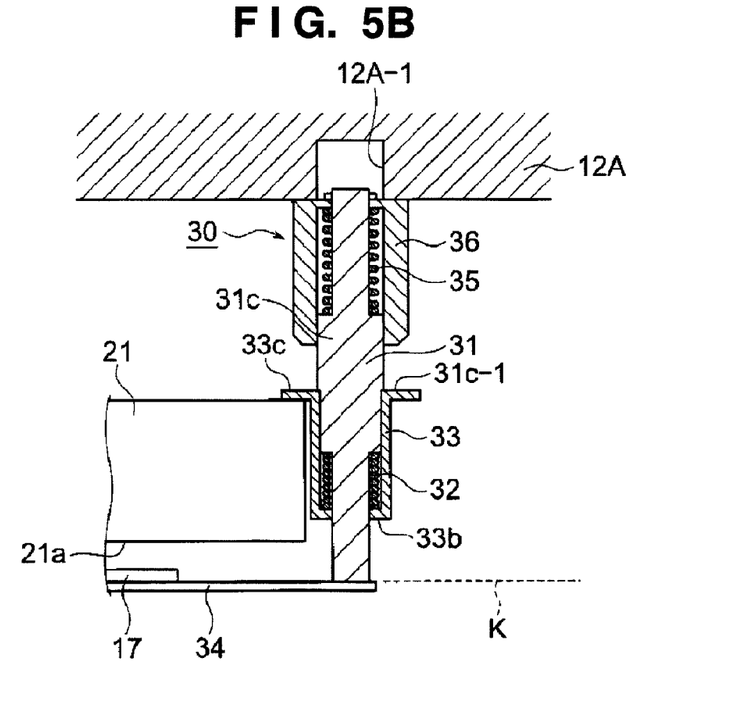
FIG. 5B is an enlarged operation state view of the substrate chuck mechanism member.

FIGS. 5A and 5B show the state in which upon opening the gate valve 14, the upper arm 13B of the substrate transport mechanism 13 has moved to the right limit and entered the vacuum processing chamber 12, and the coil spring 32 has completed its compression in the process of upward movement of the substrate holder 21. Referring to FIGS. 5A and 5B, in the vacuum processing chamber 12, the substrate holder 21 has moved upward until the substrate chuck plate 34 reaches a nearly level position indicated by the reference line K, and the end face of the second cap member 36 of the substrate chuck mechanism member 30 has abutted against the portion, of the ceiling plate 12A of the vacuum processing chamber 12, which surrounds the opening of the hole 12A-1 in the ceiling plate 12A. Referring again to FIGS. 5A and 5B, upon continuing the upper movement of the substrate holder 21 in this state, the lower coil spring 32 has started its compression first upon being pressed by upward movement of the bottom portion 33b of the first cap member 33 being locked into the substrate holder 21 by the opening flanged portion 33c, and has completed its compression. At this time, the edge of the opening flanged portion 33c of the first cap member 33 on its opening side abuts against the step 31c-1 formed on the large-diameter portion 31c to regulate its movement. On the other hand, the other coil spring 35 has still expanded, and has not yet started its compression. At this time, the contact between the substrate chuck plate 34 and the substrate mounting surface 21a of the substrate holder 21 has been canceled and these two members have separated from each other, as shown in FIG. 5B. The substrate receptacle 13C at the distal end of the upper arm 13B on the substrate transport mechanism 13 having entered the vacuum processing chamber 12 enters the space inside the horseshoe-shaped substrate chuck plate 34 through the opening 34A in the substrate chuck plate 34. In this state, the substrate 17 placed on the substrate receptacle 13C is positioned in the space (gap) between the substrate holder 21 and the substrate chuck plate 34 to face the substrate mounting surface 21a of the substrate holder 21.

Figure 6A:
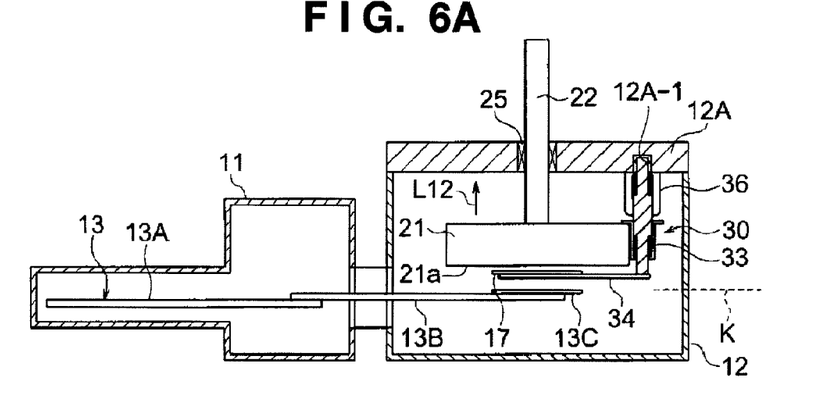
FIG. 6A is an operation state view of the entire apparatus, which shows a third operation of, for example, the substrate holding mechanism included in the substrate holder equipped with the substrate chuck mechanism member.
Figure 6B:
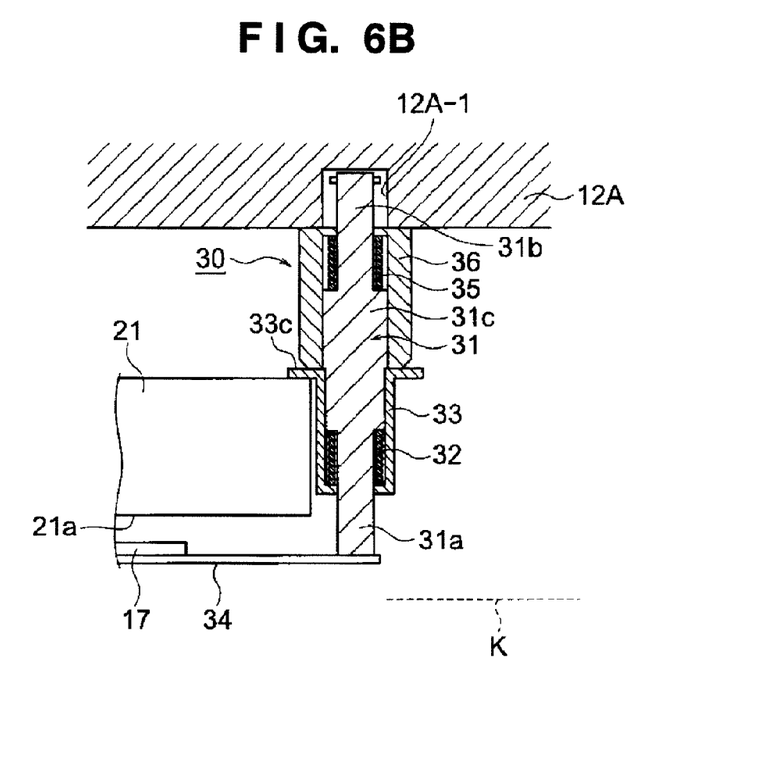
FIG. 6B is an enlarged operation state view of the substrate chuck mechanism member.

FIGS. 6A and 6B show the state in which upon further continuing the upper movement of the substrate holder 21, the upper coil spring 35 has started and completed its compression. In the vacuum processing chamber 12, the substrate holder 21 further continues its upward movement so that the substrate chuck plate 34 becomes higher than the reference line K. While the end face of the second cap member 36 of the substrate chuck mechanism member 30 abuts against the portion, of the ceiling plate 12A of the vacuum processing chamber 12, which surrounds the opening of the hole 12A-1 in the ceiling plate 12A, the coil spring 35 compresses. The small-diameter portion 31b of the shaft member 31 enters the hole 12A-1. Finally, the opening flanged portion 33c of the first cap member 33 and the lower end face of the coil spring 35 abut against each other, and the coil spring 35 completes its compression operation. FIGS. 6A and 6B show the operation state at that time. At this time, the substrate 17 separates from the substrate receptacle 13C of the upper arm 13B, and is placed on the substrate chuck plate 34 of the substrate chuck mechanism member 30. Thus, the substrate 17 moves from the substrate transport mechanism 13 to the substrate chuck mechanism member 30. In this state, the substrate 17 faces the substrate mounting surface 21a of the substrate holder 21.

Figure 7A:
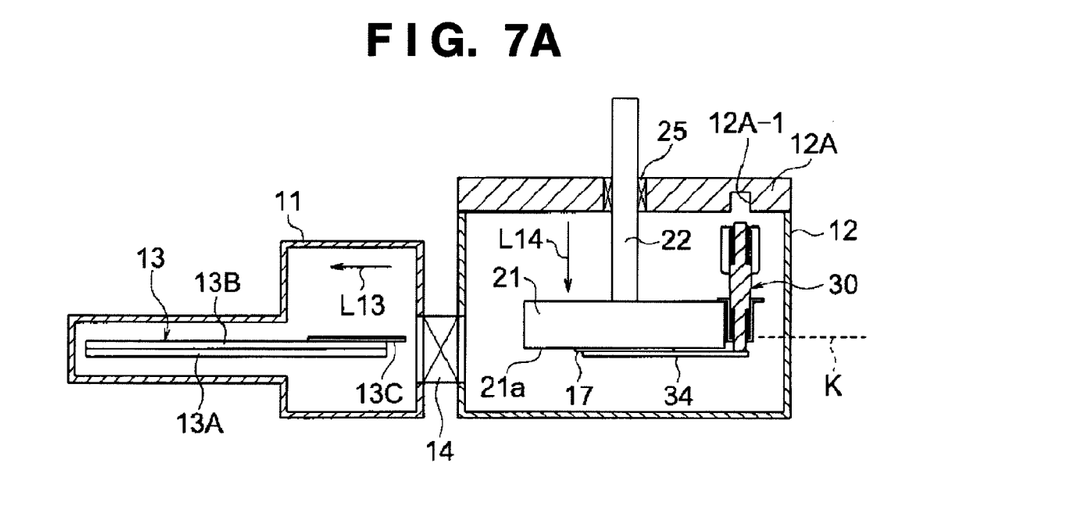
FIG. 7A is an operation state view of the entire apparatus, which shows a fourth operation state of, for example, the substrate holding mechanism included in the substrate holder equipped with the substrate chuck mechanism member.
Figure 7B:
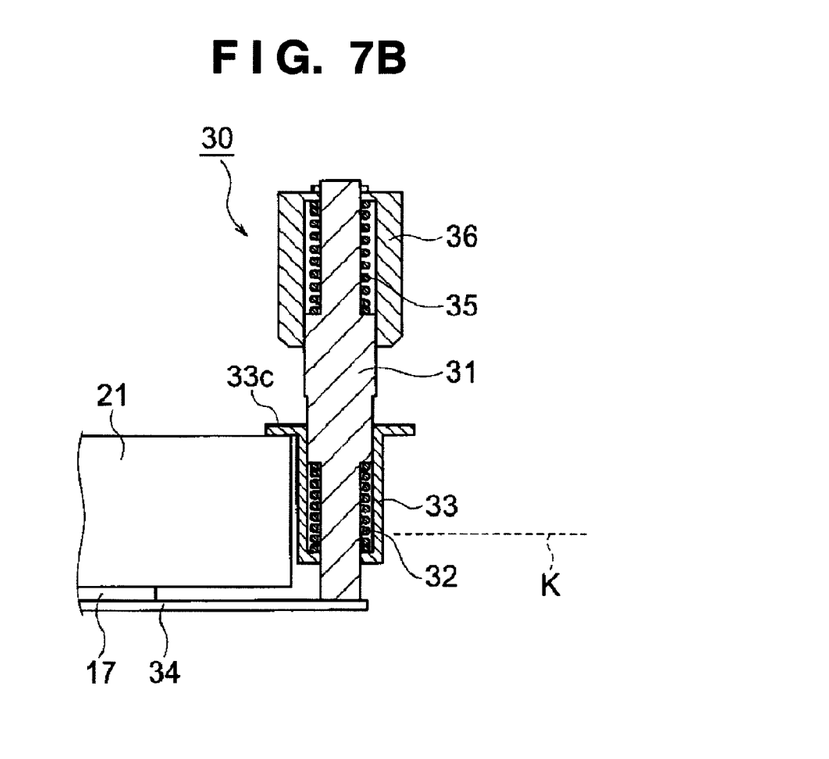
FIG. 7B is an enlarged operation state view of the substrate chuck mechanism member.

FIGS. 7A and 7B show the state before the substrate 17 starts to be processed in the vacuum processing chamber 12. In this state, the upper arm 13B of the substrate transport mechanism 13 has moved in a direction (leftward) indicated by an arrow L13, the substrate holder 21 has moved in a direction (downward) indicated by an arrow L14 so that the substrate chuck plate 34 becomes lower than the reference line K, and the gate valve 14 has closed. As a result, the transport chamber 11 and the vacuum processing chamber 12 are separated from each other. The two coil springs 32 and 35 built into the substrate chuck mechanism member 30 both change from a compressed state to an expanded state and assume their initial state, that is, the state described with reference to FIGS. 4A and 4B. However, in this state, the substrate 17 to be processed is placed on the substrate chuck plate 34, and is therefore fixed onto the substrate mounting surface 21a of the substrate holder 21, as shown in FIGS. 7A and 7B. After that, necessary processing is performed on the surface of the substrate 17.

After the processing of the substrate 17 is completed in the vacuum processing chamber 12, the processed substrate 17 is unloaded from the vacuum processing chamber 12 by opening the gate valve 14, extending the substrate transport mechanism 13 to a position below the substrate 17, and changing the lower coil spring 32 to a compressed state to set the above-mentioned state shown in FIGS. 5A and 5B.

The arrangement, shape, size, and layout explained in the above-described embodiment have been merely schematically presented so that the present invention can be understood and practiced, and the numerical values and the composition (material) of each configuration, for example, are merely examples. Therefore, the present invention is not limited to the above-described embodiment, and can be changed into various forms without departing from the scope of a technical idea presented in claims.

A vacuum processing apparatus according to the present invention can realize a substrate chuck device only by separately providing a substrate chuck mechanism member to a substrate holder in a substrate holding mechanism, and is used as that including a substrate chuck device with a simple arrangement.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:
1. A vacuum processing apparatus comprising:
a transport chamber equipped with a substrate transport mechanism,
a vacuum processing chamber configured to process a substrate fixed on a substrate mounting surface of a substrate holder, wherein the substrate mounting surface is a bottom surface of the substrate holder,
a communicating portion which is free to open to communicate the transport chamber and the vacuum processing chamber with each other in transporting the substrate from the transport chamber onto the substrate mounting surface of the substrate holder in the vacuum processing chamber by the substrate transport mechanism, and
a substrate holding mechanism configured to fix an upper surface of the substrate on the substrate mounting surface and configured to rotate the substrate holder and move upward or downward together with the substrate holder,
wherein the substrate holding mechanism comprises:
a driving unit configured to rotate the substrate holder in a circumferential direction via a support shaft which supports the substrate holder and reciprocally moves the substrate holder within a predetermined range in an axial direction of the support shaft;
a shaft member arranged outside the periphery of the substrate holder so as not to penetrate the substrate holder;
a first elastic member and a second elastic member that are provided at two ends, respectively, of said shaft member, wherein said first elastic member is provided at a lower end side of said shaft member, and said second elastic member is provided at an upper end side of said shaft member; and
a substrate chuck mechanism member which includes a first cap member provided to said shaft member so as to receive elastic biasing of said first elastic member and a substrate chuck plate provided at the lower end of said shaft member, and is configured to clamp an edge of the substrate holder between the substrate chuck plate and the first cap member biased by the elastic biasing of said first elastic member,
wherein at least said shaft member, said first elastic member and said second elastic member, and said substrate chuck mechanism member are arranged so as to be capable of simultaneous rotational movement in the circumferential direction as well as simultaneous reciprocal movement in the axial direction with the substrate holder, and
wherein a holding state of the substrate on the substrate holder is changed by expansion/contraction actions of said first elastic member and said second elastic member in accordance with the reciprocal movement of the substrate holder.

2. The apparatus according to claim 1,
wherein the first cap member is free to move in an axial direction of said shaft member and compresses said first elastic member,
wherein said substrate chuck mechanism member includes a second cap member which is free to move in the axial direction of said shaft member and compresses said second elastic member, and
wherein the substrate holder is clamped by said substrate chuck plate and a flanged portion of said first cap member.

3. The apparatus according to claim 2, wherein a hole which permits movement of said shaft member of said substrate chuck mechanism member and regulates movement of said second cap member, both in moving the substrate holder, is formed in a wall portion of the vacuum processing chamber.

4. The apparatus according to claim 1, wherein the substrate is transferred to said substrate chuck plate by the substrate transport mechanism including a multi-step slide guide capable of rectilinear movement.

* * * * *